(12) United States Patent
Hung et al.

(10) Patent No.: US 10,216,570 B2
(45) Date of Patent: Feb. 26, 2019

(54) MEMORY DEVICE AND CONTROL METHOD THEREOF

(71) Applicant: WINBOND ELECTRONICS CORPORATION, Taichung (TW)

(72) Inventors: Hsi-Hsien Hung, Palo Alto, CA (US); Seow Fong Lim, Fremont, CA (US)

(73) Assignee: Winbond Electronics Corporation, Taichung (TW)

( * ) Notice: Subject to any disclaimer, the term of this patent is extended or adjusted under 35 U.S.C. 154(b) by 116 days.

(21) Appl. No.: 15/420,367

(22) Filed: Jan. 31, 2017

(65) Prior Publication Data

US 2018/0217893 A1   Aug. 2, 2018

(51) Int. Cl.
| | |
|---|---|
| G11C 29/00 | (2006.01) |
| G06F 11/10 | (2006.01) |
| G11C 16/34 | (2006.01) |
| G11C 16/26 | (2006.01) |
| G11C 16/10 | (2006.01) |
| G11C 16/08 | (2006.01) |
| G11C 16/16 | (2006.01) |

(52) U.S. Cl.
CPC .......... G06F 11/1044 (2013.01); G11C 16/08 (2013.01); G11C 16/10 (2013.01); G11C 16/16 (2013.01); G11C 16/26 (2013.01); G11C 16/3431 (2013.01)

(58) Field of Classification Search
CPC ..... G06F 11/1044; G11C 16/16; G11C 16/08; G11C 16/26; G11C 16/3431; G11C 16/10
See application file for complete search history.

(56) References Cited

U.S. PATENT DOCUMENTS

| | | | |
|---|---|---|---|
| 7,791,949 B2 | 9/2010 | Yen et al. | |
| 8,009,498 B2 | 8/2011 | Chang et al. | |
| 2008/0068912 A1* | 3/2008 | Lee | G11C 11/40622 365/222 |
| 2010/0067295 A1* | 3/2010 | Yen | G11C 16/10 365/185.02 |
| 2011/0093671 A1* | 4/2011 | Swaminathan | G11C 16/16 711/156 |
| 2011/0110175 A1* | 5/2011 | Chang | G11C 11/406 365/222 |

FOREIGN PATENT DOCUMENTS

| | | |
|---|---|---|
| TW | 201011761 A | 9/1997 |
| TW | 201117209 A | 5/2011 |

* cited by examiner

*Primary Examiner* — Thien Nguyen (74) *Attorney, Agent, or Firm* — Finnegan, Henderson, Farabow, Garrett & Dunner LLP (57) ABSTRACT

A memory device includes a memory block including a plurality of sectors, and a control unit configured to: pre-store a plurality of first indicators in a storage unit, the plurality of first indicators respectively corresponding to a plurality of refresh units in the memory block, each refresh unit including at least one sector, and the first indicators being generated based on a first reference voltage level; and in an erase cycle for erasing a target sector of the memory block: read data from a selected one of the refresh units with a second reference voltage level; generate a second indicator for the selected refresh unit based on the data; compare one of the first indicators corresponding to the selected refresh unit with the second indicator of the selected refresh unit; and if the second indicator is not equal to the first indicator, refresh data in the selected refresh unit.

18 Claims, 8 Drawing Sheets

MEMORY DEVICE AND CONTROL METHOD THEREOF

FIELD OF THE DISCLOSURE

The present disclosure relates to a memory device and a method for controlling the memory device and, more particularly, to a method of performing a refresh operation on the memory device.

BACKGROUND

A flash memory device is a specific type of non-volatile memory by which bits of logical data are stored in memory cells arrayed in one or more memory blocks. The memory cells can be programmed to store logical data "0", or be erased to store logical value "1". Usually, a memory block is erased first prior to being programmed with data. Sometimes, a memory block can be partially erased, i.e., a selected portion of the memory block is erased, while the unselected portion of the memory block is not erased. In such case, the unselected portion of the memory block needs to be refreshed in order to ensure data integrity.

SUMMARY

According to an embodiment of the disclosure, a memory device is provided. The memory device includes a memory block including a plurality of sectors, and a control unit configured to: pre-store a plurality of first indicators in a storage unit, the plurality of first indicators respectively corresponding to a plurality of refresh units in the memory block, each refresh unit including at least one sector, and the first indicators being generated based on a first reference voltage level; and in an erase cycle for erasing a target sector of the memory block: read data from a selected one of the refresh units with a second reference voltage level; generate a second indicator for the selected refresh unit based on the data; compare one of the first indicators corresponding to the selected refresh unit with the second indicator of the selected refresh unit; and if the second indicator is not equal to the first indicator, refresh data in the selected refresh unit.

According to an embodiment of the disclosure, a method of refreshing data in a memory device is provided. The method includes pre-storing a plurality of first indicators in a storage unit, the plurality of first indicators respectively corresponding to a plurality of refresh units in a memory block which includes a plurality of sectors, each refresh unit including at least one sector, and the first indicators being generated based on a first reference voltage level. The method also includes, in an erase cycle for erasing a target sector of the memory block: reading data from a selected one of the refresh units with a second reference voltage level; generating a second indicator for the selected refresh unit based on the data; comparing one of the first indicators corresponding to the selected refresh unit with the second indicator of the selected refresh unit; and if the second indicator is not equal to the first indicator, refreshing data in the selected refresh unit.

The accompanying drawings, which are incorporated in and constitute a part of this application, illustrate disclosed embodiments and, together with the description, serve to explain the disclosed embodiments.

DETAILED DESCRIPTION

Reference will now be made in detail to the present embodiments, examples of which are illustrated in the accompanying drawings. Wherever possible, the same reference numbers will be used throughout the drawings to refer to the same or like parts.

Figure 1:
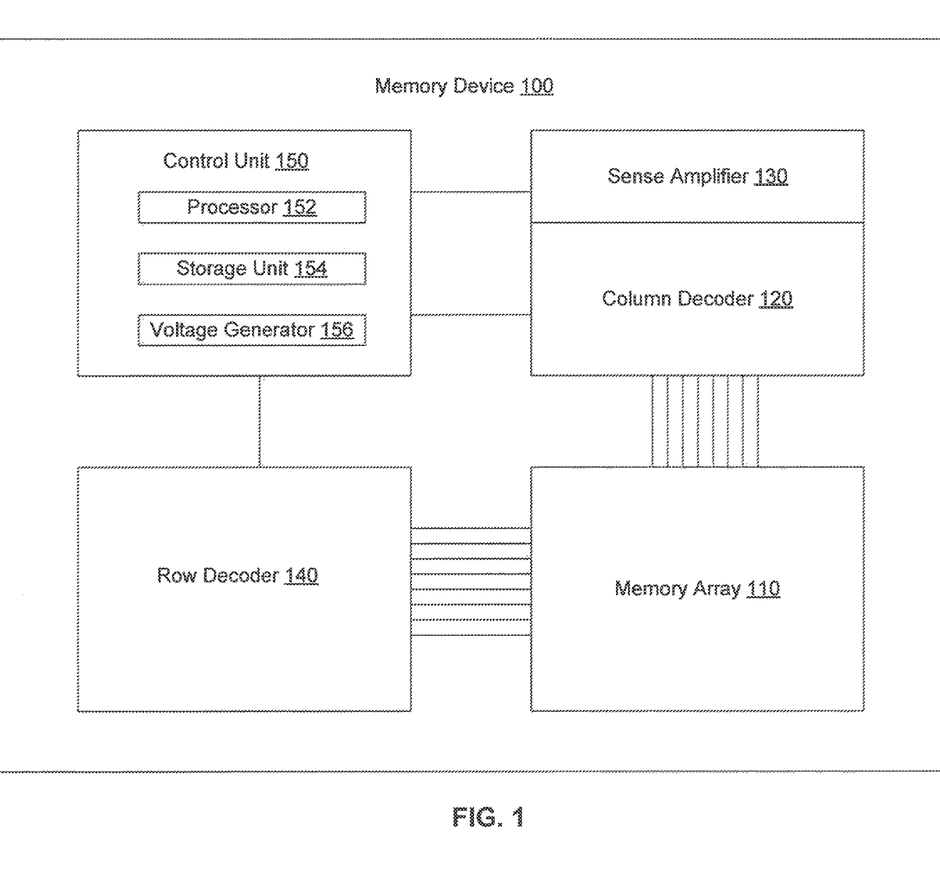
FIG. 1 is a schematic diagram of a memory device, according to an illustrated embodiment.

FIG. 1 is a schematic diagram of a memory device 100, according to an illustrated embodiment. According to FIG. 1, memory device 100 includes a memory array 110 including a plurality of memory cells arranged in rows and columns. Memory device 100 also includes a column decoder 120, a sense amplifier 130, a row decoder 140, and a control unit 150. Column decoder 120 is coupled to a plurality of local bit lines in memory array 110 for accessing individual columns of memory cells in memory array 110. Row decoder 140 is coupled to a plurality of word lines in memory array 110 for accessing individual rows of memory cells in memory array 110. Sense amplifier 130 is coupled to memory array 110 for reading data stored in the memory cells in memory array 110. Although column decoder 120, sense amplifier 130, and row decoder 140 are illustrated as separate circuits, those skilled in the art will recognize that column decoder 120, sense amplifier 130, and row decoder 140 can be combined in one circuit.

Control unit 150 is coupled to column decoder 120, sense amplifier 130, and row decoder 140 for controlling operations of column decoder 120, sense amplifier 130, and row decoder 140 in response to commands from an external device (not shown). In the embodiment illustrated in FIG. 1, control unit 150 includes a processor 152, a storage unit 154, and a voltage generator 156. Storage unit 154 is configured to store instructions executed by processor 152 to control operations of column decoder 120, sense amplifier 130, and row decoder 140 in response to command signals from the external device. Processor 152 is a general-purpose processor that can be configured to execute the instructions stored in storage unit 154. Voltage generator 156 is configured to generate various voltages for controlling the operations of column decoder 120, sense amplifier 130, and row decoder 140. In an alternative embodiment, control unit 150 can include special-purpose logic circuits that are configured to control operations of column decoder 120, sense amplifier 130, and row decoder 140.

Figure 2:
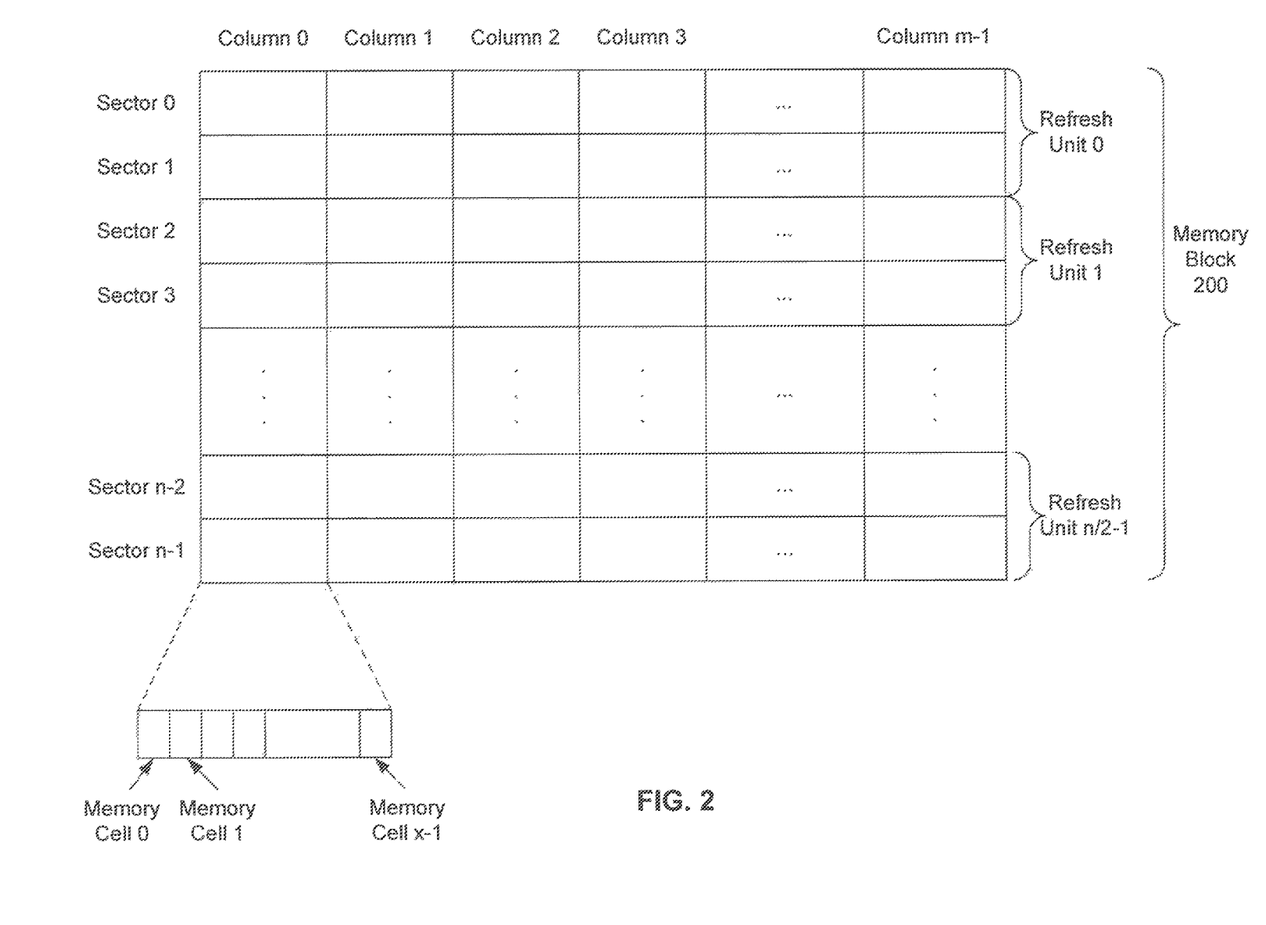
FIG. 2 is a schematic diagram of a memory block.

Generally, memory array 110 includes a plurality of blocks of memory cells, hereinafter referred to as memory blocks. A memory block is fabricated in an isolated well in a semiconductor substrate. FIG. 2 is a schematic diagram of a memory block 200. According to FIG. 2, memory block 200 consists of n sectors of memory cells, i.e., Sector 0, Sector 1, . . . , Sector n−1. Each sector consists of m columns of memory cells, i.e., Column 0, Column 1, . . . , Column m−1. Each column consists of x memory cells, i.e., Memory Cell 0, Memory Cell 1, . . . , Memory Cell x−1. For example, a 2 megabit (Mb) memory block consists of 64 sectors, each sector consists of 1024 columns, and each column consists of 32 memory cells. The n sectors Sector 0, Sector 1, . . . , Sector n−1 in memory block 200 are fabricated in a single triple well, which is isolated from other triple wells in which sectors of other memory blocks are fabricated. Memory block 200 can be divided into a plurality of refresh units, each refresh unit consisting of one or more sectors. In the example illustrated in FIG. 2, each refresh unit consists of two sectors, and therefore memory block 200 includes n/2 refresh units Refresh Unit 0, Refresh Unit 1, . . . , Refresh Unit n/2−1.

Figure 3:
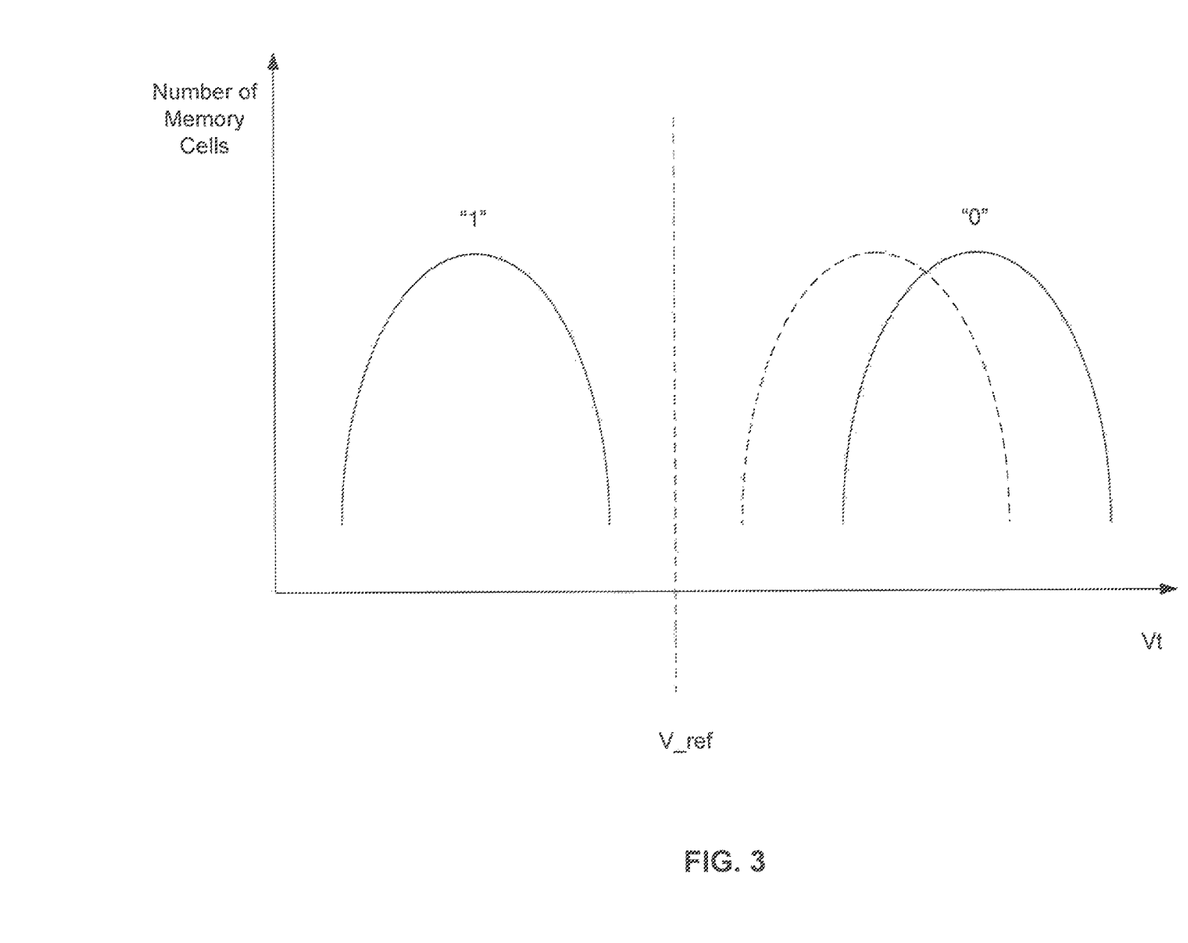
FIG. 3 is a threshold voltage distribution of memory cells in a memory device.

FIG. 3 is a threshold voltage distribution of memory cells in a memory device. A memory cell can have a relatively high threshold voltage Vt which is higher than a reference voltage level V_ref, or a relatively low threshold voltage Vt which is lower than the reference voltage level V_ref. The relatively high threshold voltage Vt represents a logical value "0". The relatively low threshold voltage Vt represents a logical value "1". An operation for writing "0" is referred to as a program operation. An operation for writing "1" is referred to as an erase operation. Generally, the erase operation can be performed at the same time for a sector of memory cells in an erase cycle.

Figure 4:
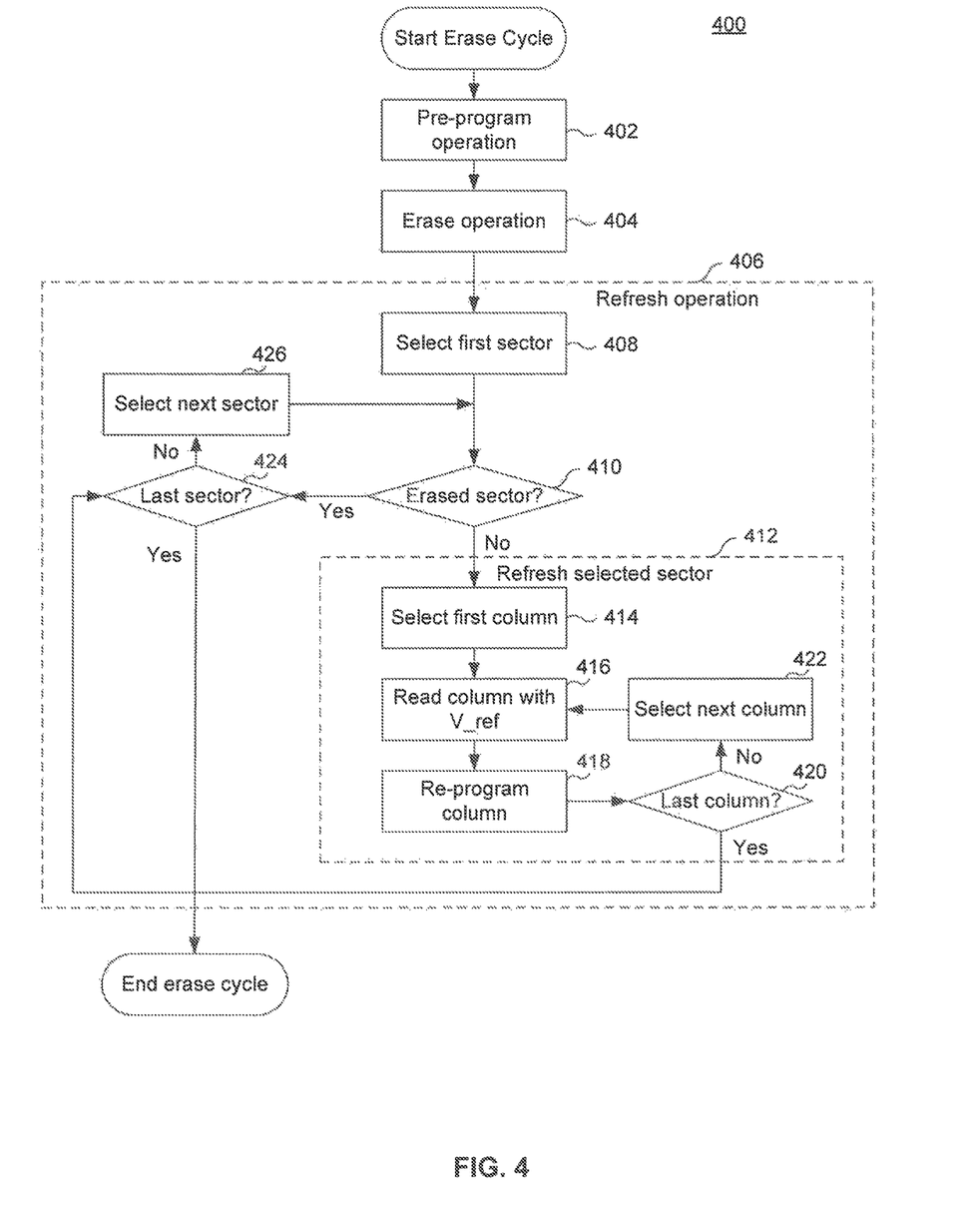
FIG. 4 is a flowchart of a process of an erase cycle for erasing a target sector of memory cells in a memory block, according to a comparative example.

FIG. 4 is a flowchart of a process 400 of an erase cycle for erasing a target sector of memory cells in a memory block, according to a comparative example. Process 400 can be performed by control unit 150 of FIG. 1.

According to FIG. 4, in step 402, control unit 150 performs a pre-program operation on the target sector of memory cells. In the pre-program operation, all of the memory cells in the target sector are programmed to have a uniformly high threshold voltage Vt. In step 404, control unit 150 performs an erase operation on the target sector of memory cells. In the erase operation, all of the memory cells in the target sector are erased to have a low threshold voltage Vt, which is lower than the reference voltage level V_ref. As a result of the erase operation, the target sector becomes an erased sector.

In steps 402 and 404, the other sectors (hereinafter referred to as "non-erased sectors") included in the same memory block as the erased sector may be disturbed by various voltages applied to the target sector during the pre-program operation (step 402) and the erase operation (step 404). This is because these non-erased sectors are fabricated in the same isolated well as the erased sector. As a result, the threshold voltage Vt of the non-erased sectors storing logical data "0" may be reduced as, for example, shown as the dotted line distribution in the threshold voltage distribution of FIG. 3, potentially causing errors when reading data from these non-erased sectors. Therefore, a refresh operation is required to recover the data of the disturbed sectors in the memory block.

In the comparative example illustrated in FIG. 4, the refresh operation is performed to refresh all of the non-erased sectors in the memory block (step 406). Specifically, during the refresh operation in step 406, control unit 150 selects a first sector in the memory block (step 408). Control unit 150 determines whether the selected section is the erased sector, i.e., the sector which was subjected to the erase operation in step 404 (step 410). If the selected sector is not the erased sector (step 410: No), control unit 150 proceeds to step 412 to refresh the selected sector. If the selected sector is the erased sector (step 410: Yes), control unit 150 proceeds to step 424, which will be described later.

During step 412 for refreshing the selected sector, control unit 150 refreshes each of the columns included in the selected sector based on data read from the corresponding column with a reference voltage level, which is equal to the reference voltage level V_ref illustrated in FIG. 3, Specifically, control unit 150 first selects a first column in the selected sector (step 414). Control unit 150 then reads the selected column with the reference voltage level V_ref (step 416). That is, control unit 150 reads data stored in the memory cells in the selected column by applying the reference voltage level V_ref to the memory cells. If the threshold voltage of a memory cell in the selected column is lower than the reference voltage level V_ref, control unit 150 obtains a logical value "1". If the threshold voltage of the memory cell in the selected column is high than the reference voltage level V_ref, control unit 150 obtains a logical value "0". After reading the selected column, control unit 150 performs a re-program operation on the selected column based on the data obtained from reading that column (step 418). That is, control unit 150 performs a re-program operation on the memory cells in the selected column based on the data read from the memory cells in the selected column. If the logical value read from a memory cell is "0", control unit 150 will re-program the memory cell to write the logical value "0" into the memory cell. If the logical value read from a memory cell is "1" control unit 150 will not re-program the memory cell.

Next, control unit 150 determines whether the selected column is the last column in the selected sector (step 420). If the selected column is not the last column in the selected sector (step 420: No), control unit 150 proceeds to step 422 to select the next column in the selected sector and then returns to step 416 to read the selected column by applying the reference voltage level V_ref. If the selected column is the last column in the selected sector (step 420: Yes), control unit 150 proceeds to step 424.

In step 424, control unit 150 determines whether the selected sector is the last sector in the memory block. If the selected sector is not the last sector in the memory block (step 424: No), control unit 150 proceeds to step 426 to select the next sector in the memory block and then returns to step 410 to determine whether the selected sector is the erased sector. If the selected sector is the last sector in the memory block (step 424: Yes), control unit 150 ends the erase cycle.

In the above-described process, each one of the non-erased sectors in the memory block is required to be refreshed in each erase cycle. As a result, the erase cycle may take a relatively long time to complete. For example, assuming that a 2 MB memory block includes 64 sectors (1 erased sector and 63 non-erased sectors), and it takes X microseconds (μs) to read one sector, and Y μs to re-program one sector, then it takes (X+Y) μs to refresh data in one sector, and it takes 63×(X+Y) μs to refresh data of all of the non-erased sectors in the memory block in each erase cycle. Because the pre-program operation in step 402 and the erase operation in step 404 consume relative short time, the refresh operation in step 406 takes most of the time during the whole erase cycle. Thus, it is desirable to reduce the time for performing the refresh operation.

In addition, every time a sector is refreshed, drain stress disturbance may be induced on memory cells included in the other sectors in the same block. The drain stress disturbance may affect the data stored in the memory cells. Thus, it is desirable to reduce the number of refresh operations in each erase cycle.

Figure 5:
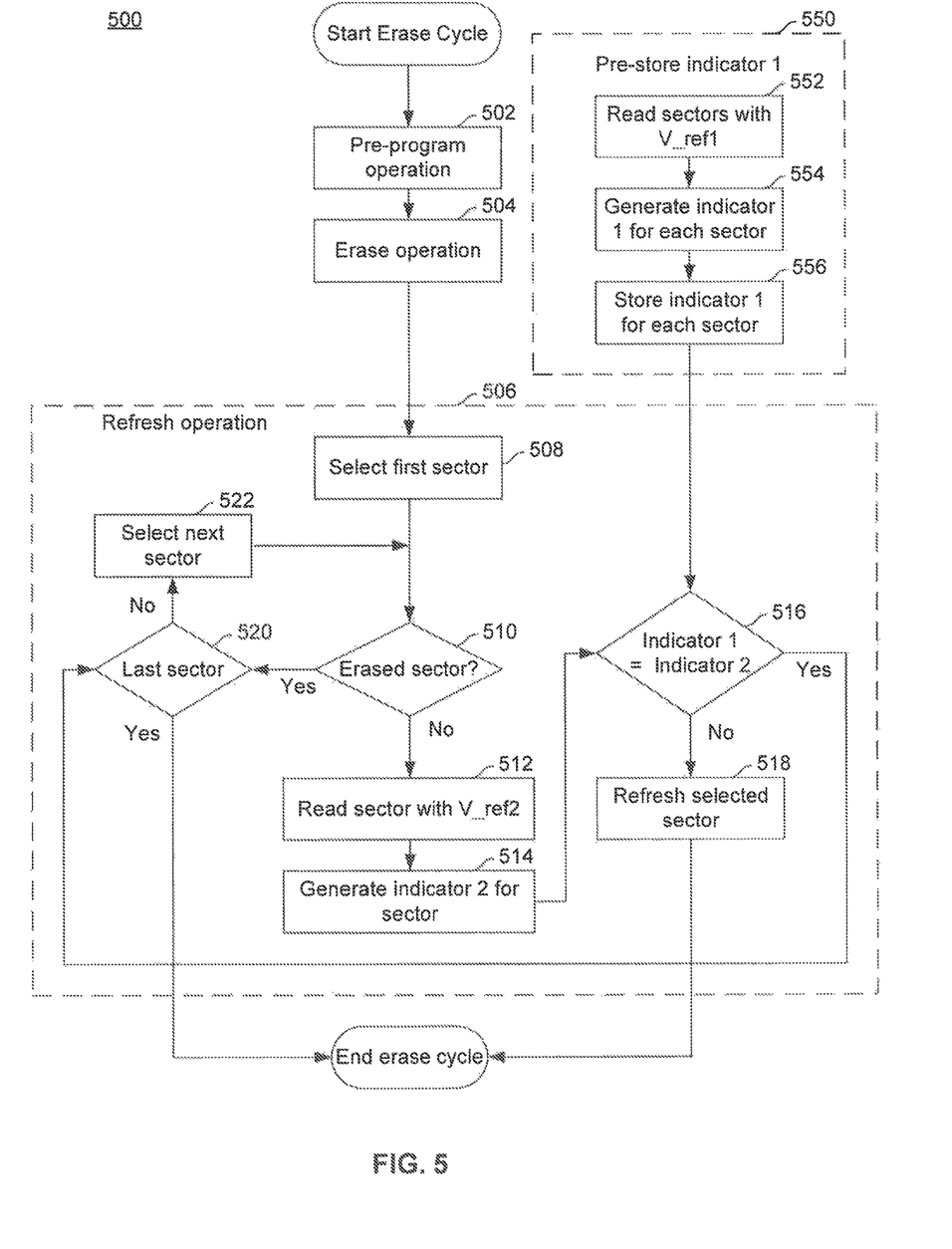
FIG. 5 is a flow chart of a process of an erase cycle for erasing a target sector of memory cells in a memory block, according to an illustrated embodiment.

FIG. 5 is a flow chart of a process 500 of an erase cycle for erasing a target sector of memory cells in a memory block, according to an illustrated embodiment. Process 500 can be performed by control unit 150 of FIG. 1.

Before describing process 500, a pre-store operation 550 will be described. Pre-store operation 550 stores a plurality of first indicators respectively corresponding to the plurality of sectors included in the memory block. The plurality of first indicators are generated based on a first reference voltage level V_ref1, which will be described in more detail below. Pre-store operation 550 can be performed before process 500 of the erase cycle, e.g., during a power-up read operation. Alternatively, pre-store operation 550 can be performed during process 500, more particularly, during a pre-program operation in step 502, which will be described below.

During pre-store operation 550, control unit 150 first reads each sector in the memory block with the first reference voltage level V_ref1 (step 552). That is, control unit 150 reads data stored in the memory cells of each sector by applying the reference voltage level V_ref1 to the memory cells.

Figure 6:
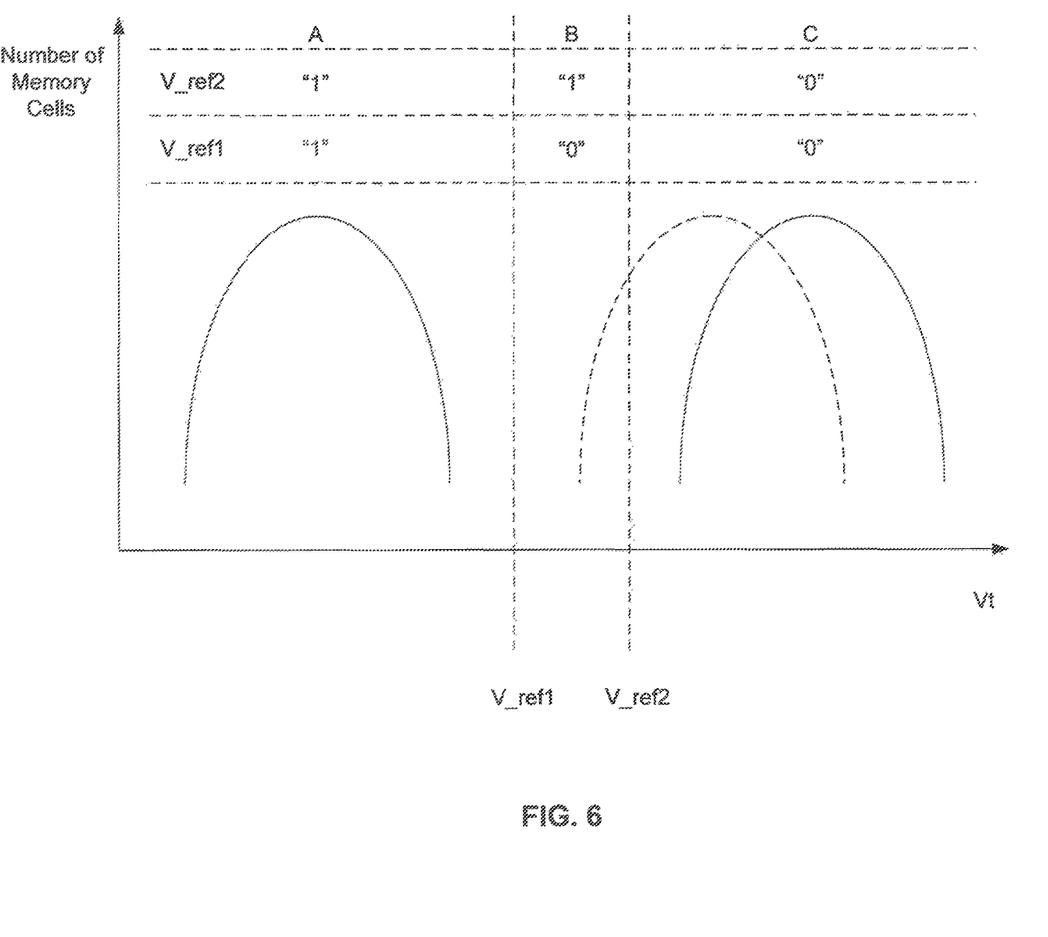
FIG. 6 is a threshold voltage distribution of memory cells in a memory device, and first and second reference voltage levels V_ref1 and V_ref2, according to an illustrated embodiment.

FIG. 6 is a threshold voltage distribution of memory cells in a memory device, and first and second reference voltage levels V_ref1 and V_ref2, according to an illustrated embodiment. As illustrated in FIG. 6, first reference voltage level V_ref1 is equal to the reference voltage level V_ref illustrated in FIG. 3. The second reference voltage level V_ref2 is higher than the first reference voltage level V_ref1. When control unit 150 reads data from a memory cell by applying the first reference voltage level V_ref1, if the threshold voltage of the memory cell is located in region A, i.e., is lower than the first reference voltage level V_ref1, control unit 150 obtains a logical value "1"; and if the threshold voltage of the memory cell is located in region B or C, i.e., is higher than the first reference voltage level V_ref1 control unit 150 obtains a logical value "0". When control unit 150 reads data from a memory cell by applying the second reference voltage level V_ref2, if the threshold voltage of the memory cell is located in region A or B, i.e., is lower than the second reference voltage level V_ref2, control unit 150 obtains a logical value "1"; and if the threshold voltage of the memory cell is located in region C, i.e., is higher than the second reference voltage level V_ref2, control unit 150 obtains a logical value "0". If a memory cell has a threshold voltage located in region B, the memory cell needs to be refreshed, i.e., re-programmed to move the threshold voltage to region C. If a memory cell has a threshold voltage located in region A or C, the memory cell does not need to be refreshed.

Referring back to FIG. 5, after control unit 150 reads each sector with the first reference voltage level V_ref1, control unit 150 generates a first indicator for each sector based on the data read from each sector (step 554). The first indicator can be a cyclic redundancy check (CRC) error status indicator, an error correction check (ECC) parity bits error status indicator, a number "1"'s calculation error status indicator representing the number of "1"'s in the data read from the corresponding sector, or a number "0"'s calculation error status indicator representing the number of "0"'s in the data read from the corresponding sector. For example, control unit 150 can include a CRC generator, an ECC generator, a number "1"'s generator, or a number "0"'s for processing the data read from each sector and generating the first indicators.

After generating the first indicator for each sector, control unit 150 stores the generated first indicators for all sectors in a storage unit (step 556). The storage unit can be included in control unit 150 or in memory array 110 of FIG. 1.

Referring to the erase cycle in process 500, in step 502, control unit 150 performs a pre-program operation on the target sector of memory cells. In step 504, control unit 150 performs an erase operation on the target sector of memory cells, such that the target sector becomes an erased sector. The pre-program operation in step 502 and the erase operation in step 504 are the same as the pre-program operation in step 402 and the erase operation in step 404, respectively, and thus detailed descriptions related to the steps 502 and 504 are not repeated. After step 504, control unit 150 performs a refresh operation to refresh a non-erased sector fabricated in the same memory block as the erased sector (step 506).

During the refresh operation in step 506, controller 150 selects a first sector in the memory block (step 508). Control unit 150 then determines whether the selected section is the erased sector, i.e., the sector which was subjected to the erase operation in step 504 (step 510). If the selected sector is the erased sector (step 510: Yes), control unit 150 proceeds to step 520 which will be described later.

If the selected sector is not the erased sector (step 510: No), i.e., the selected sector is a non-erased sector, control unit 150 reads the selected sector with the second reference voltage level V_ref2 (step 512). That is, control unit 150 reads data from the memory cells in the selected sector by applying the second reference voltage level V_ref2 to the memory cells. Then, control unit 150 generates a second indicator for the selected sector based on the data read from the selected sector with the second reference voltage level V_ref2 (step 514). Like the first indicators the second indicator can be a CRC error status indicator, an ECC parity bits error status indicator, a number "1"'s calculation error status indicator or a number "0"'s calculation error status indicator. The type of the second indicator is the same as the type of the first indicators. For example, if the first indicators are CRC error status indicators, the second indicator is also a CRC error status indicator.

After control unit 150 generates the second indicator for the selected sector, control unit 150 determines whether the first indicator of the selected sector is equal to the second indicator of the selected sector (step 516). If the first indicator is not equal to the second indicator (step 516: No), control unit 150 determines that the threshold voltage of at least one memory cell in the selected sector drops below the second reference voltage level V_ref2. In such case, control unit 150 proceeds to step 518 to refresh the selected sector. During step 518, control unit 150 refreshes each of the columns included in the selected sector based on data read from the corresponding column with the first reference voltage level V_ref1. Step 518 is similar to step 412 of FIG. 4, and thus a detailed description of step 518 is not repeated. After refreshing the selected sector, control unit 150 ends the erase cycle.

If the first indicator is equal to the second indicator (step 516: Yes), control unit 150 proceeds to step 520 to determine whether the selected sector is the last sector in the memory block. If the selected sector is not the last sector in the memory block (step 520: No), control unit 150 proceeds to step 522 to select the next sector and then returns to step 510 to determine whether the selected sector is the erased sector.

If the selected sector is the last sector in the memory block (step 520: Yes), control unit 150 ends the erase cycle.

In the embodiment described with reference to FIG. 5, only one sector is refreshed in each erase cycle. In a best case scenario, the sector that needs to be refreshed is the first non-erased sector in the memory block. Then the refresh operation in step 506 only takes 2X+Y µs, i.e., X µs for reading the sector in step 512 plus (X+Y) µs for refreshing the sector in step 518. In a worst case scenario, the sector that needs to be refreshed is the last non-erased sector in the memory block consisting of 63 non-erased sectors and one erased sector. Then the refresh operation in step 506 takes 64X+Y µs, i.e., 63×X µs for reading the 63 non-erased sector plus (X+Y) µs for refreshing the sector in step 518. Alternatively, if none of the 63 non-erased sectors needs to be refreshed, i.e., the first indicator and the second indicator of each sector are equal, then the refresh operation in step 506 takes 63×X µs, i.e., the time for reading the 63 sectors in step 512. In any of the above cases, the time required for completing the refresh operation in step 506 is greatly reduced compared to the time 63×(X+Y) µs required for the refresh operation in step 406.

In the embodiment described with reference to FIG. 5, the refresh operation in step 506 is performed in the unit of one sector. In some other embodiments, the refresh operation can be performed in the unit of more than one sector. The unit for performing the refresh operation is referred to as a "refresh unit". A refresh unit can consist of one or more sectors. The size of the refresh unit can be configured by a user.

Figure 7:
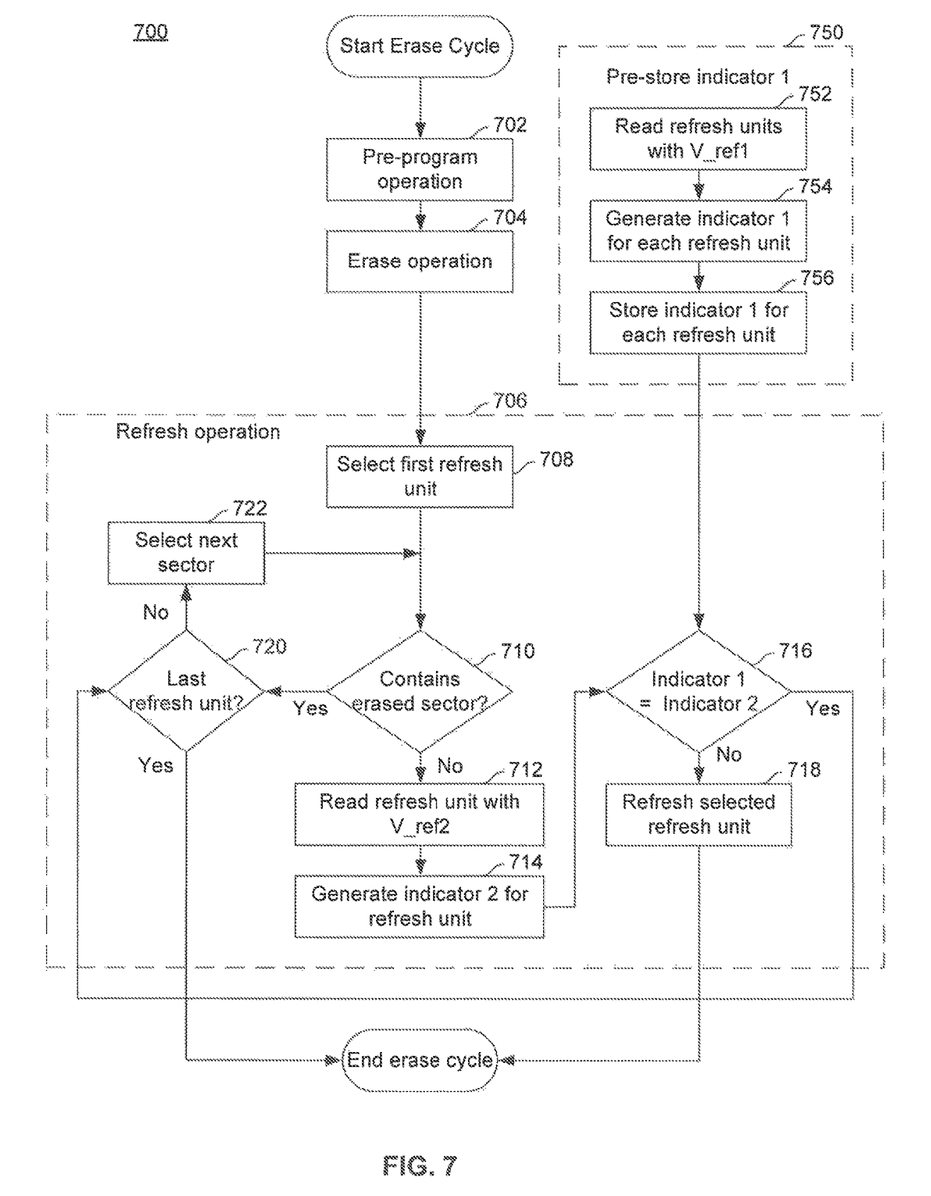
FIG. 7 is a flow chart of a process of an erase cycle for erasing a target sector of memory cells in a memory block, according to another illustrated embodiment.

FIG. 7 is a flow chart of a process 700 of an erase cycle for erasing a target sector of memory cells in a memory block, according to an illustrated embodiment. In this embodiment, the refresh process is performed in a refresh unit consisting of one or more sectors. Process 700 can be performed by control unit 150 of FIG. 1. In this embodiment, the memory block consists of a plurality of refresh units, and each refresh unit consists of one or more sectors.

Before describing process 700, a pre-store operation 750 will be described. Pre-store operation 750 stores a plurality of first indicators respectively corresponding to the plurality of refresh units in the memory block. Pre-store operation 750 can be performed before process 700 of the erase cycle, e.g., during a power-up read operation. Alternatively, pre-store operation 750 can be performed during process 700, more particularly, during a pre-program operation in step 702, which will be described below.

During pre-store operation 750, control unit 150 first reads each refresh unit in the memory block with a first reference voltage level V_ref1 (step 752). That is, control unit 150 reads data stored in the memory cells of each refresh unit by applying the reference voltage level V_ref1 to the memory cells.

After control unit 150 reads each refresh unit with the first reference voltage level V_ref1, control unit 150 generates a first indicator for each refresh unit based on the data read from each sector (step 754). The first indicator can be a CRC error status indicator, an ECO parity bits error status indicator, a number "1"'s calculation error status indicator, or a number "0"'s calculation error status indicator.

After generating the first indicator for each refresh unit, control unit 150 stores the generated first indicators for all refresh units in a storage unit (step 756). The storage unit can be included in control unit 150 or memory array 110 of FIG. 1.

Referring to the erase cycle in process 700, in step 702, control unit 150 performs a pre-program operation on the target sector of memory cells. In step 704, control unit 150 performs an erase operation on the target sector of memory cells, such that the target sector becomes an erased sector. The pre-program operation in step 702 and the erase operation in step 704 are the same as the pre-program operation in step 402 and the erase operation in step 404, respectively, and thus detailed descriptions related to the steps 702 and 704 are not repeated. After step 704, control unit 150 performs a refresh operation to refresh a refresh unit (step 706).

During the refresh process in step 706, controller 150 selects a first refresh unit in the memory block (step 708). Control unit 150 then determines whether the selected refresh unit contains the erased sector, i.e., the sector which was subjected to the erase operation in step 704 (step 710). If the selected refresh unit contains the erased sector (step 710: Yes), control unit 150 proceeds to step 720 which will be described later.

If the selected refresh unit does not contain the erased sector (step 710: No), control unit 150 reads the selected refresh unit with the second reference voltage level V_ref2 (step 712). That is, control unit 150 reads data from the memory cells in the selected refresh unit by applying the second reference voltage level V_ref2 to the memory cells. Then, control unit 150 generates a second indicator for the selected refresh unit based on the data read from the refresh unit with the second reference voltage level V_ref2 (step 714). Like the first indicators, the second indicator can be a CRC error status indicator, an ECC parity bits error status indicator, a number "1"'s calculation error status indicator or a number "0"'s calculation error status indicator. The type of the second indicator is the same as the type of the first indicators. For example, if the first indicators are CRC error status indicators, the second indicator is also a CRC error status indicator.

After control unit 150 generates the second indicator for the selected refresh unit, control unit 150 determines whether the first indicator of the selected refresh unit is equal to the second indicator of the selected refresh unit (step 716). If the first indicator is not equal to the second indicator (step 716: No), control unit 150 determines that the threshold voltage of at least one memory cell in the selected refresh unit drops below the second reference voltage level V_ref2. In such case, control unit 150 proceeds to step 718 to refresh the selected refresh unit. During step 718, control unit 150 refreshes each of the columns includes in each of the sectors in the selected refresh unit based on data read from the corresponding column with the first reference voltage level V_ref1. Step 718 will be described with respect to FIG. 8. After refreshing the selected refresh unit, control unit 150 ends the erase cycle.

If the first indicator is equal to the second indicator (step 716: Yes), control unit 150 proceeds to step 720 to determine whether the selected refresh unit is the last refresh unit in the memory block. If the selected refresh unit is not the last refresh unit in the memory block (step 720: No), control unit 150 proceeds to step 722 to select the next refresh unit and then returns to step 710 to determine whether the selected refresh unit contains the erased sector. If the selected refresh unit is the last sector in the memory block (step 720: Yes), control unit 150 ends the erase cycle.

Figure 8:
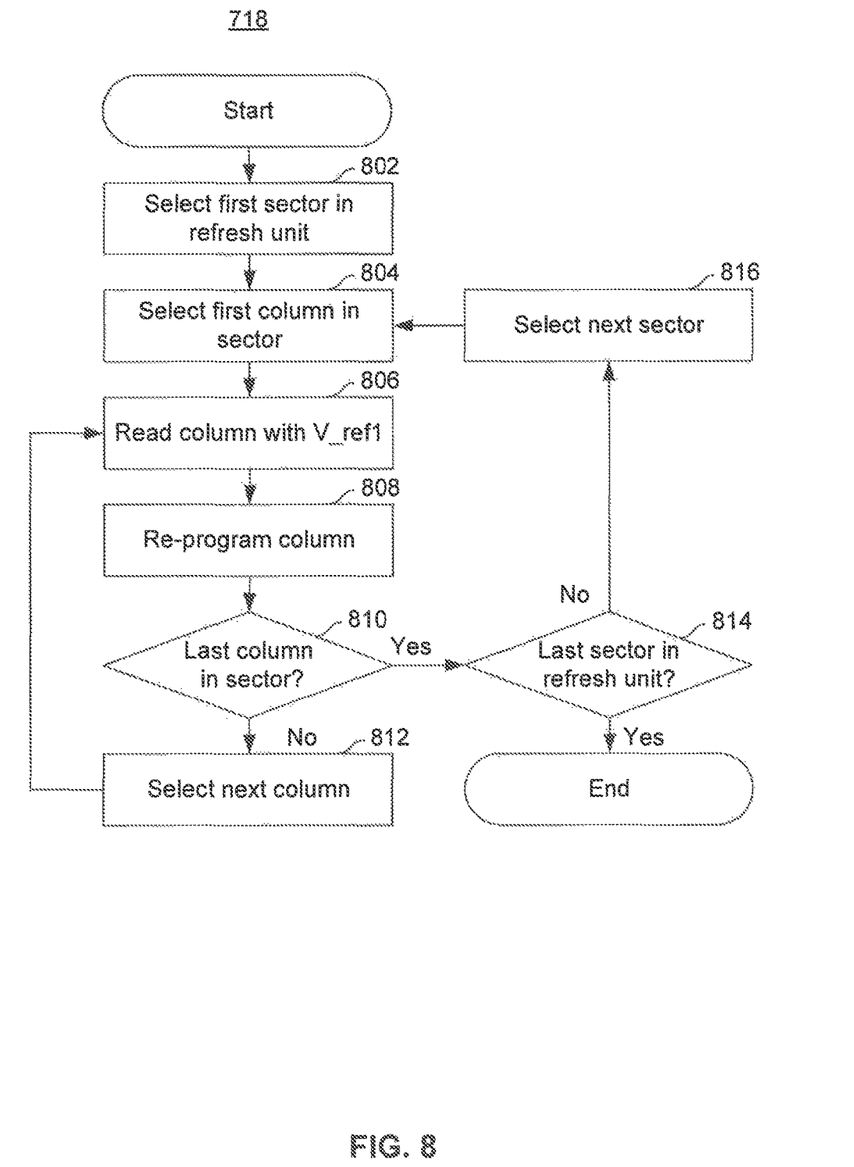
FIG. 8 is a flow chart of a process for refreshing a selected refresh unit, according to an illustrated embodiment.

FIG. 8 is a flow chart of a process for refreshing a selected refresh unit in step 718, according to an illustrated embodiment. According to FIG. 8, control unit 150 first selects a first sector in the selected refresh unit (step 802). Control unit 150 then selects a first column in the selected sector (step 804). Control unit 150 then reads the selected column with the first reference voltage level V_ref1 (step 806). After reading the selected column, control unit 150 re-programs the selected column based on the data obtained from reading the selected sector (step 808). Next, control unit 150 determines whether the selected column is the last column in the selected sector (step 810). If the selected column is not the last column in the selected sector (step 810: No), control unit 150 selects the next column in the selected sector (step 812), and then returns to step 806 to read the selected column with the first reference voltage level V_ref. If the selected column is the last column in the selected sector (step 810: Yes), control unit 150 determines whether the selected sector is the last sector in the refresh unit (step 814). If the selected sector is not the last sector in the refresh unit (step 814: No), control unit 150 selects the next sector in the refresh unit (step 816), and then returns to step 804 to select the first column in the selected sector. If the selected sector is the last sector in the refresh unit (step 814: Yes), control unit 150 ends step 718.

In the embodiment described with reference to FIGS. 7 and 8, one refresh unit is refreshed in each erase cycle. Each refresh unit can include one or more sectors. For the following example, the memory block is divided into 32 refresh unit and each refresh unit includes two sectors. In a best case scenario, the refresh unit that needs to be refreshed, is the first refresh unit in the memory block. Then the refresh operation in step 706 takes 4X+2Y μs, i.e., 2×X μs for reading the refresh unit including two sectors in step 712, plus 2×(X+Y) μs for refreshing the refresh unit in step 718. In a worst case scenario, the refresh unit that needs to be refreshed is the last refresh unit in the memory block consisting of 31 refresh units that do not contain the erased sector. Then the refresh operation in step 706 takes 64X+2Y μs, i.e., 2×X×31=62X μs for reading the 31 refresh units plus 2×(X+Y) μs for refreshing the refresh unit in step 718. Alternatively, if none of the 31 refresh units needs to be refreshed, then the refresh operation in step 706 only takes 2×X×31=62X, i.e., the time for reading the 31 refresh units in step 712. In any of the above cases the time required for the refresh operation in step 706 is greatly reduced compared to the time 63×(X+Y) μs required for the refresh operation in step 406.

According to the above-described embodiments, the refresh operation in an erase cycle is only performed on one sector or one refresh unit consisting of part of the sectors of the memory block. Therefore, the time required to complete the refresh operation is greatly reduced. In addition, the number of read and re-program operations is greatly reduced, increasing the reliability of the memory device.

Other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A memory device, comprising:
a memory block including a plurality of sectors and a plurality of refresh units, each refresh unit including at least one of the plurality of sectors; and
a control unit configured to:
pre-store a plurality of first indicators in a storage unit, the plurality of first indicators respectively corresponding to the plurality of refresh units in the memory block, and each one of the plurality of first indicators being generated based on data obtained by reading a corresponding one of the plurality of refresh units with a first reference voltage level; and
in an erase cycle for erasing a target sector of the plurality of sectors in the memory block:
selecting one of the plurality of refresh units;
read data from the selected refresh unit with a second reference voltage level different from the first reference voltage level;
generate a second indicator for the selected refresh unit based on the data read from the selected refresh unit with the second reference voltage level;
compare one of the plurality of first indicators that corresponds to the selected refresh unit with the second indicator of the selected refresh unit;
if the second indicator of the selected refresh unit is not equal to the one of the plurality of first indicators that corresponds to the selected refresh unit, refresh data in the selected refresh unit; and
if the second indicator of the selected refresh unit is equal to the one of the plurality of first indicators that corresponds to the selected refresh unit, select a next one of the plurality of refresh units.

2. The memory device of claim 1, wherein the control unit is further configured to:
after refreshing data in the selected refresh unit, exit the erase cycle.

3. The memory device of claim 1, wherein, when pre-storing a plurality of first indicators in a storage unit, the control unit is configured to:
read data from one of the plurality of refresh units with the first reference voltage level;
generate a first indicator for the one refresh unit based on the data read from the one refresh unit; and
store the first indicator in the storage unit.

4. The memory device of claim 1, wherein each of the plurality of refresh units includes a sector, and the sector includes a plurality of columns,
the control unit being configured to, when refreshing data in the selected refresh unit, for one of the plurality of columns:
read data from the one of the plurality of columns with the first reference voltage level; and
re-program the one of the plurality of columns based on the data read from the one of the plurality of columns with the first reference voltage level.

5. The memory device of claim 1, wherein each of the plurality of refresh units includes a plurality of sectors, and each sector includes a plurality of columns,
the control unit being configured to, when refreshing data in the selected refresh unit, for one of the plurality of columns in one of the plurality of sectors:
read data from the one of the plurality of columns in the one of the plurality of sectors with the first reference voltage level; and
re-program the one of the plurality of columns in the one of the plurality of sectors based on the data read from the one of the plurality of columns in the one of the plurality of sectors with the first reference voltage level.

6. The memory device of claim 1, wherein the first and second indicators include at least one of a cyclic redundancy check (CRC) error status indicator, an error correction check (ECC) parity bits error status indicator, or a number "1"'s calculation error status indicator.

7. The memory device of claim 1, wherein the control unit is further configured to, in the erase cycle:

pre-program the target sector; and
erase the target sector.

8. The memory device of claim 7, wherein the control unit is configured to pre-store the plurality of first indicators in the storage unit before the erase cycle.

9. The memory device of claim 7, wherein the control unit is configured to pre-store the plurality of first indicators in the storage unit while pre-programming the target sector.

10. A method of refreshing data in a memory block of a memory device, the memory block comprising a plurality of sectors and a plurality of refresh units, each refresh unit comprising at least one of the plurality of sectors, the method comprising:
pre-storing a plurality of first indicators in a storage unit, the plurality of first indicators respectively corresponding to the plurality of refresh units in the memory block and each one of the plurality of first indicators being generated based on data obtained by reading a corresponding one of the plurality of refresh units with a first reference voltage level; and in an erase cycle for erasing a target sector of the plurality of sectors in the memory block:
selecting one of the plurality of refresh units;
reading data from the selected refresh unit with a second reference voltage level different from the first reference voltage level;
generating a second indicator for the selected refresh unit based on the data read from the selected refresh unit with the second reference voltage level;
comparing one of the plurality of first indicators that corresponds to the selected refresh unit with the second indicator of the selected refresh unit;
if the second indicator of the selected refresh unit is not equal to the one of the plurality of first indicators that corresponds to the selected refresh unit, refreshing data in the selected refresh unit; and
if the second indicator of the selected refresh unit is equal to the one of the plurality of first indicators that corresponds to the selected refresh unit, selecting a next one of the plurality of refresh units.

11. The method of claim 10, further including:
after refreshing data in the selected refresh unit, exiting the erase cycle.

12. The method of claim 10, wherein pre-storing a plurality of first indicators in a storage unit includes:
reading data from one of the plurality of refresh units with the first reference voltage level;
generating a first indicator for the one refresh unit based on the data read from the one refresh unit; and
storing the first indicator in the storage unit.

13. The method of claim 10, wherein each of the plurality of refresh units includes a sector, and the sector includes a plurality of columns,
refreshing data in the selected refresh unit including, for one of the plurality of columns:
reading data from the one of the plurality of columns with the first reference voltage level; and
re-programming the one of the plurality of columns based on the data read from the one of the plurality of columns with the first reference voltage level.

14. The method of claim 10, wherein each of the plurality of refresh units includes a plurality of sectors, and each sector includes a plurality of columns,
refreshing data in the selected refresh unit including, for one of the plurality of columns in one of the plurality of sectors:
reading data from the one of the plurality of columns in the one of the plurality of sectors with the first reference voltage level; and
re-programming the one of the plurality of columns in the one of the plurality of sectors based on the data read from the one of the plurality of columns in the one of the plurality of sectors with the first reference voltage level.

15. The method of claim 10, wherein the first and second indicators include at least one of a cyclic redundancy check (CRC) error status indicator, an error correction check (ECC) parity bits error status indicator, or a number "1"'s calculation error status indicator.

16. The method of claim 10, further including, in the erase cycle:
pre-programming the target sector; and
erasing the target sector.

17. The method of claim 16, further including pre-storing the plurality of first indicators in the storage unit before the erase cycle.

18. The method of claim 16, further including pre-storing the plurality of first indicators in the storage unit while pre-programming the target sector.

\* \* \* \* \*